United States Patent [19]
Ebrecht

[11] 3,933,046
[45] Jan. 20, 1976

[54] LOGARITHMIC RESISTANCE-TO-FREQUENCY CONVERTER

[75] Inventor: Dietrich Meyer Ebrecht, Hamburg, Germany

[73] Assignee: U.S. Philips Corporation, New York, N.Y.

[22] Filed: Feb. 15, 1973

[21] Appl. No.: 332,734

[30] Foreign Application Priority Data
Mar. 1, 1972 Germany............................ 2209770

[52] U.S. Cl............. 73/362 AR; 323/75 K; 331/66; 331/140
[51] Int. Cl.² ......................................... G01K 7/24
[58] Field of Search...... 73/362 R, 362 AR; 331/66, 331/110, 140, 141; 324/78 J; 323/75 H, 75 K

[56] References Cited
UNITED STATES PATENTS

| | | | |
|---|---|---|---|
| 2,426,232 | 8/1947 | Newhouse | 324/78 J X |
| 3,217,144 | 11/1965 | Hinnah | 73/362 R UX |
| 3,345,874 | 10/1967 | Carniol et al. | 73/362 CP |
| 3,461,392 | 8/1969 | Hughs et al. | 324/78 J UX |
| 3,555,448 | 1/1971 | Clarke et al. | 331/141 X |
| 3,560,877 | 2/1971 | Ilin et al. | 331/110 |
| 3,572,109 | 3/1971 | Yerman | 331/141 UX |
| 3,731,535 | 5/1973 | Wendt | 73/362 CP |
| 3,817,105 | 6/1974 | Luhowy | 73/362 AR |

FOREIGN PATENTS OR APPLICATIONS
1,015,843   1/1966   United Kingdom................ 331/141

OTHER PUBLICATIONS
Lovborg, L., A Linear Temperature-to-Frequency Converter, In the Jour. Sci. Instr., Vol. 42, 1965, pp. 611–614.

Primary Examiner—Richard C. Queisser
Assistant Examiner—Frederick Shoon
Attorney, Agent, or Firm—Frank R. Trifari; Bernard Franzblau

[57] ABSTRACT

By including four resistors and a capacitor in a bridge and connecting the bridge to the input terminals and the output terminals of a comparator amplifier a relaxation oscillator is obtained the square-wave frequency of which depends logarithmically upon the ratio of two resistances. Linearization is obtained by using a measuring-value transducer the resistance of which depends exponentially upon a physical quantity, such as temperature, as one of the resistors. The converter may be used in frequency-analog transmission of measuring values and in measuring instruments for measuring-value indication without the need for linearizing steps.

9 Claims, 1 Drawing Figure

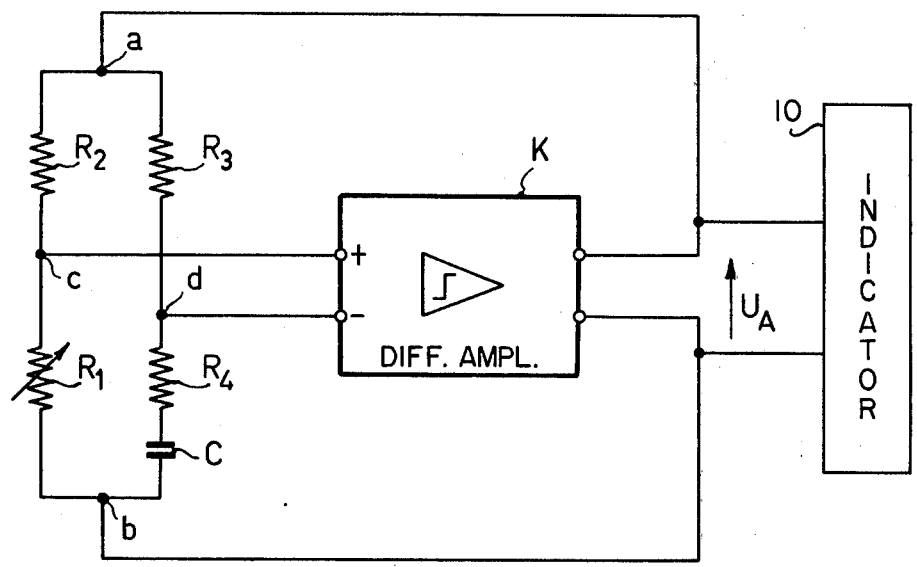

LOGARITHMIC RESISTANCE-TO-FREQUENCY CONVERTER

The invention relates to a logarithmic resistance-to-frequency converter in which the period of a generated square wave is proportional to the natural logarithm of a resistance ratio.

It is known to include resistors in the frequency-determining network of an oscillator circuit to influence the frequency of the oscillator. An example of such a circuit is the Wien-bridge oscillator. However, in this oscillator there is a square-law relation between the frequency and an adjustable resistance value. On the other hand, by means of control circuits, a linear relation between the resistance and the frequency or the period is obtainable.

When a logarithmic relation between resistance and frequency or period is desired, additional provisions must be made to realize this function. For this purpose, logarithmic amplifiers or function-generating networks may be used in an analog part of the circuit.

In particular when the variable resistor is a measuring-value transducer the resistance of which depends upon a physical quantity, it may be advantageous to introduce a logarithmic or exponential function.

Examples of such measuring-value transducers are temperature transducers using negative temperature coefficient resistors or semiconductor single-crystal resistance thermometers which have exponential characteristics. Such exponential characteristics can be used to provide an indication of the measured physical quantity by using suitably graduated scales. However, this requires special scales and moreover the electric signal cannot be linearized. Linearization is obtainable by means of particular non-linear networks of the aforementioned type in which, for example, the exponential current-voltage characteristic of at least one semiconductor diode is utilized. However, a satisfactory degree of accuracy is only obtainable by complex means because, in particular, owing to the temperature dependence of the diode characteristics, expensive compensating provisions are required.

It is an object of the invention to provide a circuit arrangement which includes an oscillator the period of which depends logarithmically upon the ratio of two resistors. This is achieved by providing four ohmic resistors and a capacitor which form a bridge circuit three arms of which comprise a first resistor, a second resistor and a third resistor, respectively, while a fourth arm comprises the series combination of a fourth resistor and a capacitor. Two opposite bridge supply points are connected to the two output terminals of a voltage comparator that may comprise a differential amplifier followed by a bistable circuit, e.g., a Schmitt trigger. The use of a Schmitt trigger to convert a sine wave into a square wave is described in U.S. Pat. No. 3,217,144 in the name of H. D. Hinnah. The two input terminals of the comparator are connected to the two opposite measuring points of the bridge in a manner such that the circuit is self-oscillating and a square wave can be derived from the differential amplifier output terminals. The resistance ratio is determined by the ratio of the values of the first and second resistors situated between the bridge supply points. Thus a relaxation oscillator is obtained the frequency of which in principle depends only on the parameters of linear passive elements which may be considerably more stable than the parameters of non-linear and active elements such as, for example, diodes and transistors. In this manner a high-accuracy output signal of digital nature is obtainable by simple means.

Except where the logarithmic relation is necessary, for example when sound levels are to be measured or frequency characteristics are to be determined, it may be useful to convert a large resistance variation into a comparatively small frequency variation capable of being transmitted via telecommunication channels.

The converter according to the invention may also be used to advantage in analog or digital measuring instruments in which a measured value is displayed either on a pointer instrument having a linear scale or directly in digits. No linearization is required when the relation between the physical quantity to be measured and a resistance has an exponential character.

Furthermore it is of advantage that a frequency-analogous indication of measurements greatly simplifies transmission between galvanic or capacitive isolated points. These are required in particular in process control (protection against explosions) and in medical electronics.

An embodiment of the invention will now be described, by way of example, with reference to the accompanying drawing the single FIGURE of which is a circuit diagram of a circuit arrangement according to the invention.

In the FIGURE the series combination of the resistance measuring-value transducer $R_1$ and the fixed resistor $R_2$ form one bridge arm which lies between input terminals $a$ and $b$ of the bridge. The second bridge arm is formed by the series combination of two fixed resistors $R_3$ and $R_4$ and a capacitor C, which capacitor is connected to the same input terminal $b$ of the bridge as is the transducer $R_1$. Output terminals $c$ and $d$ of the bridge form the junction points between the resistors $R_2$ and $R_1$ and between the resistors $R_3$ and $R_4$.

These output terminals of the bridge are connected to the input terminals of a comparator amplifier K the output terminals of which are connected to the input terminals $a$ and $b$ of the bridge. The comparator K is a commercially available high gain differential amplifier which reverses the polarity of the output voltage $U_A$ when the voltage at its input terminals passes through zero and changes sign. The connections between the bridge circuit and the comparator are made so as to produce a self-oscillating circuit, i.e., the bridge forms a positive feedback path for the comparator.

First it is assumed that the output voltage from the comparator has a polarity such that the input terminal $a$ of the bridge is positive with respect to its input terminal $b$. It is further assumed that the capacitor C has completely been discharged. Suitable proportioning of the resistors $R_1$ to $R_4$ enables the output terminal $c$ of the bridge to be more positive than its output terminal $d$. For example, the values of the two resistors $R_3$ and $R_4$ may be equal and in the resistance range to be converted the value of the resistor $R_2$ always is greater than that of the transducer $R_1$. The capacitor C is charged via the resistors $R_3$ and $R_4$ so that the voltage at the output terminal $d$ becomes increasingly more positive. As soon as this voltage becomes so positive that the bridge output voltage, i.e., the voltage $U_E$ between the terminals $c$ and $d$ passes through zero and changes sign, the polarity of the output voltage $U_A$ of the comparator is reversed. Since the capacitor C has been positively charged, the voltage at the output terminal $c$ is considerably more negative than the voltage at the terminal $d$. As a result, the capacitor C is negatively charged via the resistors $R_3$ and $R_4$ until the bridge output voltage $U_E$ again passes through zero. Thus the circuit operates as a relaxation oscillator the frequency of which depends upon the absolute values of the resistors $R_3$ and $R_4$ and of the capacitor C and upon the ratio of the resistances of $R_1$ and $R_2$.

An accurate computation of the complete oscillation period $\tau_o$ of the oscillator results in the following expression:

$$\tau_o = 2(R_3 + R_4) C \ln \left[ 2 \frac{R_1 + R_2}{R_2} \cdot \frac{R_3}{R_3 + R_4} - 1 \right] \quad (1)$$

where $\ln$ is the logarithm to the base $e$. If $R_3 = R_4$, the expression is simplified to:

$$\tau_o = 4 R_3 C \ln \frac{R_1}{R_2} \quad (2)$$

In the case of a resistance thermometer which operates on the dependence of the intrinsic conductivity upon the absolute temperature $T$ in semiconductor materials, the dependence of the resistance upon the temperature is $$R_1 = R_0 e^{K/T}, \quad (3)$$

where $R_0$ and $K$ are constants, $R_1$ is the resistance value and $T$ is absolute temperature in degrees Kelvin. This characteristic is accurately maintained in particular in resistance thermometers consisting of highly pure single-crystal semiconductors. From the equations (2) and (3) it follows that the oscillator frequency $f_0$ becomes proportional to the absolute temperature, if $R_2 = R_0$:

$$f_o = T \frac{1}{4R_3 C K} \quad (4)$$

Deviations from the ideal characteristic, for example for correcting small deviations of the transducer characteristic from the ideal exponential behaviour, are obtainable by means of inequality of the resistors $R_3$ and $R_4$ and/or $R_2$ and $R_0$. The finite switching time of the comparator amplifier may similarly be compensated for.

For further processing the output frequency $f_0$ of the oscillator may be applied to an indicator device 10. For an analog indication, the device 10 may consist of a frequency-to-voltage converter, which, for example, in known manner produces a voltage proportional to the frequency by generating pulses having a constant voltage-time characteristic and by averaging these pulses via a filter. Digitization of the frequency $f_0$ may readily be achieved in the device 10 by the use of pulse counters. This is effected by applying the pulses from the oscillator to a counter in the zero position for a given time so that, at the end of this time, the counter reading is a measure of the measured value which, if a conventional binary counter is used, is directly available in coded form.

A modification renders the circuit arrangement approximately linearly sensitive to very small relative variations of the input quantity, for example of the temperature $T$. If $R_2$ is chosen to exceed $R_0$ and is proportioned so that $$\ln R_2/R_0 = K/T_0 \quad (5)$$

then with
$$T = T_0 - \Delta T$$
the period becomes $$\tau_o = 4R_3C \frac{K}{T_o - \Delta T} \cdot \frac{\Delta T}{T_o} \approx 4R_3C \frac{K}{T_o} \cdot \frac{\Delta T}{T_o} \quad (6)$$

The period $\tau_0$ can be measured with means similar to those used for measuring the frequency.

In the embodiments described the use of a high gain differential amplifier having two output terminals is assumed, the polarity of the voltage between these terminals being changed in accordance with the input signal. However, differential amplifiers having a single output terminal are available in which the voltage at this output terminal assumes one or the other or two fixed voltage values in accordance with the value of the two input voltages. In this case, for example, the upper input terminal $a$ of the bridge may be connected to this output terminal, while to the lower input terminal $b$ of the bridge is applied a fixed voltage which is equal to the mean of the two output voltage values to obtain a symmetrical output voltage.

What is claimed is:

1. A logarithmic resistance-to-frequency converter which produces a square-wave signal whose period is proportional to the natural logarithm of a resistance ratio comprising, a comparator amplifier having two input terminals and two output terminals, a first resistor, a second resistor connected in series with said first resistor to form first and second arms of a bridge circuit with said resistance ratio being determined by the resistance ratio of said first and second resistors, a third resistor, a fourth resistor, a capacitor, means connecting the third resistor in circuit to form a third arm of the bridge and the series combination of said fourth resistor and said capacitor as the fourth arm of the bridge, means connecting the bridge input terminals to the comparator amplifier output terminals and the bridge output terminals to the comparator amplifier input terminals so that the junction of the first and second bridge arms supplies a positive feedback voltage to the comparator amplifier input terminal to which it is connected whereby the circuit arrangement will self-oscillate to produce a square-wave signal at the comparator amplifier output terminals whose period varies as the natural logarithm of the resistance ratio of said first and second resistors.

2. Converter as claimed in claim 1 wherein the third and fourth resistors have equal resistance values and the first resistor comprises a measuring-value transducer.

3. Converter as claimed in claim 2, characterized in that the measuring-value transducer comprises a temperature transducer the resistance value $R_1$ of which satisfies the relation $R_1 = R_0 e^{K/T}$, where $R_0$ and $K$ are constants and $T$ is the absolute temperature in degrees Kelvin.

4. A converter as claimed in claim 2, characterized in that a counter is connected to the output terminals of the comparator amplifier and a counter reading recorded in a predetermined time interval is a measure of the measuring value.

5. A converter as claimed in claim 1 wherein said first resistor is of the type that exhibits a non-linear resistance variation as a function of a physical parameter.

6. A converter as claimed in claim 1 wherein said first resistor exhibits an exponential resistance variation as a function of a physical parameter and the bridge components are selected so that the period of the square-wave signal is determined by the absolute values of the third and fourth resistors and the capacitor and the natural logarithm of the resistance ratio of the first and second resistors.

7. A converter as claimed in claim 1 wherein the bridge forms a positive feedback circuit for the comparator amplifier to sustain oscillations and the bridge output terminals are connected to the comparator amplifier input terminals so that the junction of said first and second resistors is connected to the non-inverting input of the comparator amplifier and the junction of the third and fourth bridge arms is connected to the inverting input of said comparator amplifier.

8. A logarithmic converter which produces a square wave signal whose period is proportional to the natural logarithm of a resistance ratio comprising, a voltage comparator having two input terminals and two output terminals and means responsive to the zero passage of the voltages at the two input terminals for switching the voltage at the two output terminals between first and second fixed values of voltage, a first resistor, a second resistor connected in series with said first resistor to form first and second arms of a bridge circuit with said resistance ratio being determined by the resistance ratio of said first and second resistors, third and fourth resistors having the same value of resistance, a capacitor, means connecting the third resistor in circuit to form a third arm of the bridge and the series combination of said fourth resistor and said capacitor as the fourth arm of the bridge, means connecting the bridge input terminals to the voltage comparator output terminals and the bridge output terminals to the voltage comparator input terminals so that the circuit arrangement will self-oscillate to produce a square-wave signal at the voltage comparator output terminals whose period varies as the natural logarithm of the resistance ratio of said first and second resistors.

9. A converter as claimed in claim 8 wherein said voltage comparator comprises differential amplifier means for comparing the voltages at said two input terminals and for producing at its output terminals said first and second fixed values of voltage, said first and second voltages being of opposite polarity as a function of the relative magnitudes of the voltages at the two input terminals, and the voltage at the bridge output terminal formed by the junction of said first and second bridge arms provides positive feedback and operates as a reference voltage for the zero passage of the voltage at the other bridge output terminal and which varies exponentially with the charge and discharge of said capacitor.

* * * * *